(12) United States Patent
Yu

(10) Patent No.: US 11,138,930 B2
(45) Date of Patent: Oct. 5, 2021

(54) PIXEL STRUCTURE, DISPLAY PANEL AND CONTROL METHOD FOR THE DISPLAY PANEL

(71) Applicant: KunShan Go-Visionox Opto-Electronics Co., Ltd, Jiangsu (CN)

(72) Inventor: Jun Yu, Kunshan (CN)

(73) Assignee: KunShan Go-Visionox Opto-Electronics Co., Ltd., Kunshan (CN)

(*) Notice: Subject to any disclaimer, the term of this patent is extended or adjusted under 35 U.S.C. 154(b) by 0 days.

(21) Appl. No.: 16/941,955

(22) Filed: Jul. 29, 2020

(65) Prior Publication Data
US 2020/0357335 A1    Nov. 12, 2020

Related U.S. Application Data

(63) Continuation of application No. PCT/CN2019/073305, filed on Jan. 28, 2019.

(30) Foreign Application Priority Data

Oct. 30, 2018    (CN) .......................... 201811278779.8

(51) Int. Cl.
G09G 3/30    (2006.01)
G09G 3/32    (2016.01)
(Continued)

(52) U.S. Cl.
CPC ........ G09G 3/3225 (2013.01); H01L 27/3216 (2013.01); H01L 27/3218 (2013.01);
(Continued)

(58) Field of Classification Search
CPC .......... G09G 3/3225; G09G 3/30; G09G 3/32; G09G 3/3258; G09G 3/3266;
(Continued)

(56) References Cited

U.S. PATENT DOCUMENTS

2009/0322215 A1    12/2009    Sung et al.
2013/0161595 A1*    6/2013    Kim .................... H01L 27/3216
                                                257/40
(Continued)

FOREIGN PATENT DOCUMENTS

CN    104465712 A    3/2015
CN    106128320 A    11/2016
(Continued)

OTHER PUBLICATIONS

Office Action and Written Opinion dated Oct. 1, 2019 in corresponding Taiwanese Application No. 108103622; 18 pages including English-language translation.

(Continued)

*Primary Examiner* — Pegeman Karimi
(74) *Attorney, Agent, or Firm* — Maier & Maier, PLLC

(57) ABSTRACT

The present disclosure provides a pixel structure, a display panel and a control method for the display panel. Multiple pixel units could be arranged in a matrix. Each pixel unit could include a first sub-pixel, a second sub-pixel and a third sub-pixel. In the pixel unit, the third sub-pixel could be arranged in one line, the first sub-pixel and the second sub-pixel could be arranged in another line. The second sub-pixel could have a light emitting area greater than that of the third sub-pixel. The third sub-pixel could have a light emitting area greater than that of the first sub-pixel. In such a way, a pixel aperture ratio could be increased, a display effect could be enhanced and a service life of productions could be prolonged.

17 Claims, 3 Drawing Sheets

(51) Int. Cl.
  *G09G 3/3225* (2016.01)
  *H01L 27/32* (2006.01)
  *G09G 3/3266* (2016.01)
  *G09G 3/3275* (2016.01)

(52) U.S. Cl.
  CPC ......... *G09G 3/3266* (2013.01); *G09G 3/3275* (2013.01); *G09G 2300/0452* (2013.01); *G09G 2300/0465* (2013.01); *G09G 2310/0202* (2013.01); *G09G 2320/043* (2013.01)

(58) Field of Classification Search
  CPC ............. G09G 3/3291; G09G 2320/02; G09G 2300/0443; G09G 3/34; H01L 27/32; H01L 27/3262; H01L 29/78; H01L 29/78696; H01L 29/7869; H01L 27/1225
  See application file for complete search history.

(56) References Cited

U.S. PATENT DOCUMENTS

| | | | | |
|---|---|---|---|---|
| 2015/0061978 | A1* | 3/2015 | Shih | G09G 3/3225 345/76 |
| 2015/0138463 | A1* | 5/2015 | Jinta | H01L 27/3246 349/33 |
| 2015/0364526 | A1* | 12/2015 | Peng | H01L 27/3216 257/40 |
| 2016/0329385 | A1* | 11/2016 | Qiu | H01L 27/3218 |
| 2017/0053601 | A1* | 2/2017 | Lee | G09G 3/3291 |
| 2017/0076665 | A1* | 3/2017 | Kim | G09G 3/3275 |
| 2017/0213850 | A1* | 7/2017 | Dong | G02B 5/201 |
| 2018/0045968 | A1* | 2/2018 | Wu | G02B 27/022 |
| 2018/0173349 | A1 | 6/2018 | Cho et al. | |

FOREIGN PATENT DOCUMENTS

| | | |
|---|---|---|
| CN | 106298865 A | 1/2017 |
| CN | 106653799 A | 5/2017 |
| CN | 104659069 B | 10/2017 |
| CN | 107275360 A | 10/2017 |
| CN | 108091667 A | 5/2018 |
| CN | 108511480 A | 9/2018 |
| JP | 2006201676 A | 8/2006 |

OTHER PUBLICATIONS

First Office Action dated May 30, 2019 in corresponding Chinese Application No. 201811278779.8; 15 pages.
Second Office Action dated Aug. 2, 2019 in corresponding Chinese Application No. 201811278779.8; 14 pages.
Third Office Action dated Oct. 8, 2019 in corresponding Chinese Application No. 201811278779.8; 16 pages.
International Search Report dated Aug. 8, 2019 in corresponding International Application No. PCT/CN2019/073305; 5 pages.

* cited by examiner

PIXEL STRUCTURE, DISPLAY PANEL AND CONTROL METHOD FOR THE DISPLAY PANEL

CROSS REFERENCE TO RELATED APPLICATION

The present application is a continuation-application of International (PCT) Patent Application No. PCT/CN2019/073305 filed on Jan. 28, 2019, which claims foreign priority of Chinese Patent Application No. 201811278779.8, filed on Oct. 30, 2018 in the National Intellectual Property Administration of China, the entire contents of which are hereby incorporated in their entireties.

TECHNICAL FIELD

The present disclosure relates to a field of display technology, and more particular to a pixel structure, a display panel and a control method for the display panel.

BACKGROUND

Active-matrix organic light-emitting diode (AMOLED) is a new type of display screen emerging in recent years, which is composed of two parts, one part is a drive array, the other part is an organic light-emitting material. As the demand for display effects increases, increasing the number of pixels has become an inevitable trend in the industry. Under a condition that the Organic Light Emitting Diode (OLED) evaporation process capability and the mask process capability remain unchanged, making the sub-pixel size smaller and smaller would reduce aperture ratio of the pixel and the service life of the OLED. Therefore, an option is to reduce the number of sub-pixels, through a method of borrowing adjacent sub-pixels from adjacent pixels, a full-color display effect could be simulated, thereby creating various pixel arrangements. However, as the number of sub-pixels increases, it is still hard to meet the life expectancy.

SUMMARY

A technical problem mainly solved by the present disclosure is to increase a pixel aperture ratio, enhance a display effect and prolong a service life of productions by providing a pixel structure, a display panel and a control method for the display panel.

To solve the above-mentioned technical problem, one technical solution adopted by the present disclosure is providing a pixel structure. The pixel structure could include a plurality of pixel units arranged in a matrix along a first direction and a second direction. Each of the pixel units could include a first sub-pixel, a second sub-pixel and a third sub-pixel. In each of the pixel units, the third sub-pixel could be arranged in a line along the first direction, while the first sub-pixel and the second sub-pixel could be arranged in another line along the first direction. The second sub-pixel could have a light emitting area greater than that of the third sub-pixel, the third sub-pixel could have a light emitting area greater than that of the first sub-pixel. The first direction and the second direction could be intersected with each other.

To solve the above-mentioned technical problem, another technical solution adopted by the present disclosure is providing a display panel. The display panel could include a pixel structure. The pixel structure could include a plurality of pixel units arranged in a matrix along a first direction and a second direction. Each of the pixel units could include a first sub-pixel, a second sub-pixel and a third sub-pixel. In each of the pixel units, the third sub-pixel could be arranged in a line along the first direction, while the first sub-pixel and the second sub-pixel could be arranged in another line along the first direction. The second sub-pixel could have a light emitting area greater than that of the third sub-pixel, the third sub-pixel could have a light emitting area greater than that of the first sub-pixel. The first direction and the second direction could be intersected with each other.

To solve the above-mentioned technical problem, a further technical solution adopted by the present disclosure is providing a control method for a display panel. The method could include: outputting a scan signal to each sub-pixel in each line of pixel units, to control a conduction of a thin film transistor connecting to each sub-pixel in each line of pixel units; in a first time period, outputting a data signal to each sub-pixel in the j-th, (j+1)-th . . . (j+i)-th rows of pixel units to enable the sub-pixel to emit light; in a second time period, outputting a data signal to each sub-pixel in the k-th, (k+1)-th . . . (k+i)-th rows of pixel units to enable the sub-pixel to emit light, j, k and i are all integer numbers; pixel units in the j-th line and pixel units in the (j+1)-th line could be in the first direction; a pixel unit in the k-th line could be a combination of sub-pixels in the j-th line and the (j+1)-th line of pixel units adjacent in the second direction.

Beneficial effects of the present disclosure are: different from the prior art, in the present disclosure, the third sub-pixel could be arranged in one line, the first sub-pixel and the second sub-pixel could be arranged in another line, and the second sub-pixel could have a light emitting area greater than that of the third sub-pixel, the third sub-pixel could have a light emitting area greater than that of the first sub-pixel. In this way, a pixel aperture ratio could be increased, a display effect could be enhanced and a service life of the production could be prolonged.

DETAILED DESCRIPTION

The present disclosure will be described in detail below with reference to the drawings and embodiments.

It should be noted that, the drawings are in a very simplified form and are all not to accurate scale. They are only used to conveniently and clearly assist in illustrating embodiments of the present disclosure. Each drawing only shows a part of a corresponding structure. An actual product could be varied accordingly as required. In addition, the first row, the second row, the first column, the second column mentioned in the present disclosure are for the purpose of illustrating this disclosure and refer to what are shown in the figures, but do not necessarily refer to rows and columns of an actual product.

Figure 1:
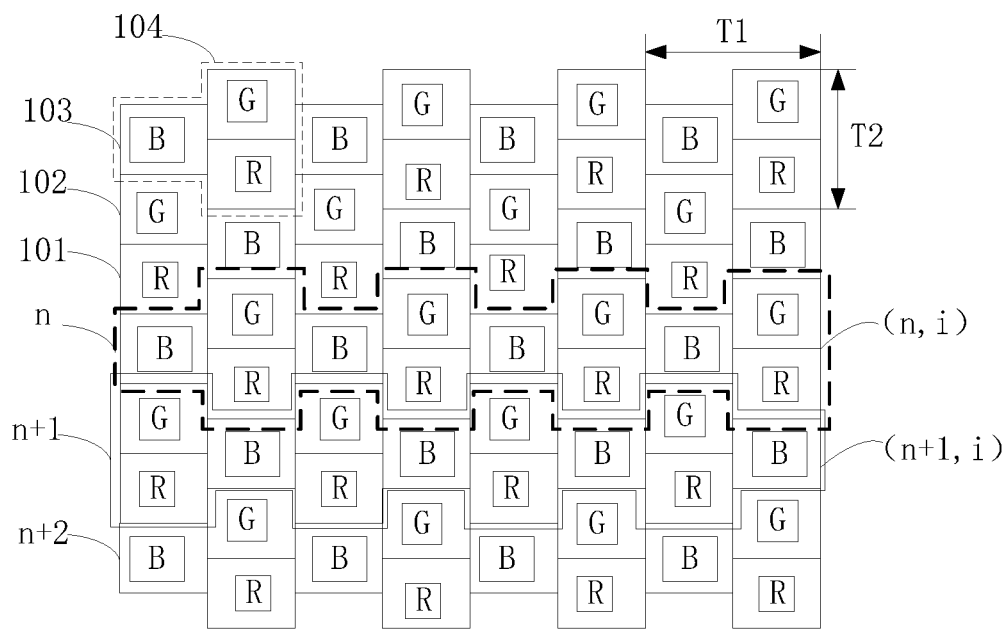
FIG. 1 is a schematic structural diagram of a pixel structure according a first embodiment of the present disclosure.

Please refer to FIG. 1, FIG. 1 is a schematic structural diagram of a pixel structure according to a first embodiment of the present disclosure.

In the present disclosure, the first direction is referred to as a column direction (a vertical direction, a Y direction), the second direction is referred to as the row direction (a transverse direction, an X direction). The first direction and the second direction are perpendicular to each other.

The pixel structure could include multiple pixel units 104. The multiple pixel units 104 could be arranged in a matrix. Each pixel unit 104 could include a first sub-pixel 101, a second sub-pixel 102 and a third sub-pixel 103.

In the pixel unit 104, the third sub-pixel 103 could be arranged in one column, the first sub-pixel 101 and the second sub-pixel 102 could be arranged in another column. The second sub-pixel 102 could have a light emitting area greater than that of the third sub-pixel 103. The third sub-pixel 103 could have a light emitting area greater than that of the first sub-pixel 101.

In the present embodiment, a sum of a length of the first sub-pixel 101 and a length of the second sub-pixel 102 along the first direction could be greater than a length of the third sub-pixel 103 along the first direction. A projection of the third sub-pixel 103 along the second direction could be at least partially overlapped with a projection of the first sub-pixel 101 along the second direction and a projection of the second sub-pixel 102 along the second direction.

Specifically, since pixel units 104 in the present disclosure could be arranged in mode that is more compact, and a shape of the pixel unit 104 could be rectangular, a total length T1 of the pixel unit 104 along the second direction could be greater than its total length T2 along the first direction, such as, T1:T2=3:2. In this way, compared with conventional square shaped pixel unit 104 (ratio of the length along the second direction to the length along the first length could be 1:1), the current pixel arrangement structure could increase the traverse pixel gap of the screen, thereby facilitating the array wiring and evaporation of organic light-emitting diodes.

Figure 1A:
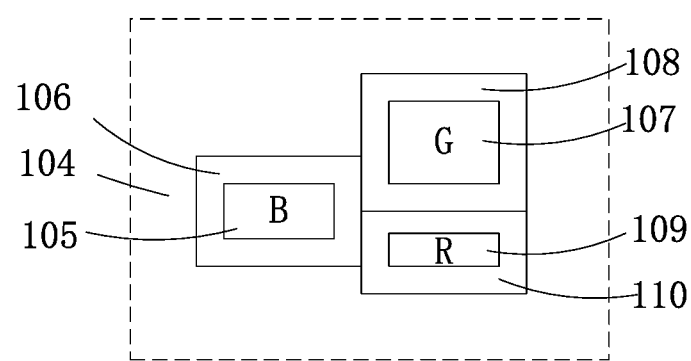
FIG. 1a is a schematic structural diagram of a pixel unit in FIG. 1.

The first sub-pixel 101 could be a red sub-pixel, the second sub-pixel 102 could be a green sub-pixel, and the third sub-pixel 103 could be a blue sub-pixel. Also referring to FIG. 1a, the first sub-pixel 101 could include a light emitting area 109 and a non light emitting area 110. The second sub-pixel 102 could include a light emitting area 107 and a non light emitting area 108. The third sub-pixel 103 could include a light emitting area 105 and a non light emitting area 106. The light emitting area 107 of the second sub-pixel 102 could be greater than the light emitting area 105 of the third sub-pixel 103. The light emitting area 105 of the third sub-pixel 103 could be greater than the light emitting area 109 of the first sub-pixel 101. Preferably, the ratio of the light emitting area 109 of the first sub-pixel 101 to the light emitting area 107 of the second sub-pixel 102 to the light emitting area 105 of the third sub-pixel 103 could be 1:1.84:1.68. Specifically, in conventional pixel arrangement, the first sub-pixel 101 (the red sub-pixel) could have a smallest light-emitting area, the second sub-pixel 102 (the green sub-pixel) could have a larger light emitting area, and the third sub-pixel 103 (the blue sub-pixel) could have the largest light-emitting area. In a white light, a brightness of the second sub-pixel 102 (the green sub-pixel) could contribute most to a brightness of the white light. Therefore, the light emitting area of the second sub-pixel 102 (the green sub-pixel) could be increased, thus the light emitting area of the second sub-pixel 102 (the green sub-pixel) could be greater than the light emitting area of the third sub-pixel 103 (the blue sub-pixel), a ratio among the first sub-pixel 101, the second sub-pixel 102 and the third sub-pixel 103 in the light-emitting area could be 1:1.84:1.68, thereby enhancing the display effect of the organic light emitting diode.

Specifically, a cathode, an anode and an electroluminescent layer (also referred to as an organic transmission layer) could be included in a light emitting area of each sub-pixel area. The electroluminescent layer could be arranged between the cathode and the anode to generate light rays with predefined color to enable the display. When preparing the display panel, in a light emitting area of a pixel region with a particular color, evaporation process could be usually employed to form electroluminescent layers with corresponding color (red, green or blue).

In the present embodiment, multiple pixel units 104 could be arranged in a pixel array. Along the second direction, multiple pixel units 104 in the n-th row could be engaged with multiple pixel units 104 in the (n+1)-th row. In a preferred case, the third sub-pixel of the i-th pixel unit 104 in the n-th row could be aligned with the first sub-pixel and the second sub-pixel of the i-th pixel unit 104 in the (n+1)-th row. The first sub-pixel and the second sub-pixel of the i-th pixel unit 104 in the n-th row could be aligned with the third sub-pixel of the i-th pixel unit 104 in the (n+1) row. In a preferred case, multiple pixel units 104 in the n-th row could be arranged in a same mode to that of multiple pixel units 104 in the (n+2) row. In such a pixel array, each row of pixel units 104 could include three sub-pixels of different colors along the first direction. And in each row of pixel units 104 along the second direction, sub-pixels of a same color do not constituent a row independently. On the contrary, sub-pixels of other colors could be interspersed therebetween, thereby increasing the display consistency greatly.

Specifically, the pixel units 104 could be divided into the first row, the second row, the third row . . . the n-th row, the (n+1)-th row, and the i-th pixel unit 104 in the n-th row could be denoted as (n,i). In the pixel array, multiple pixel units 104 in the n-th row (dotted line frame) could be engaged with multiple pixel units 104 in the (n+1)-th row (solid line frame), and the third sub-pixel 103 (the blue sub-pixel) of the i-th pixel unit 104 in the n-th row (n,i) could be aligned with the first sub-pixel 101 (the red sub-pixel) and the second sub-pixel 102 (the green sub-pixel) of the i-th pixel unit 104 in the (n+1)-th row (n+1,i), the first sub-pixel 101 (the red sub-pixel) and the second sub-pixel 102 (the green sub-pixel) of the i-th pixel unit 104 in the n-th row (n,i) could be aligned with the third sub-pixel 103 (the blue sub-pixel) of the i-th pixel unit 104 in the (n+1)-th row (n+1,i). The multiple pixel units 104 in the n-th row could be arranged in mode same to that of the multiple pixel units 104 in the (n+2)-th row. n and i could be both integer numbers.

In pixel units 104 in odd-numbered rows (in the second direction) such as the first row, the third row, the fifth row . . . the n-th row, the (n+2)-th row, the first sub-pixel 101 and the second sub-pixel 102 could be arranged on the right side, the third sub-pixel 103 could be arranged on the left side. In pixel units 104 in the even-numbered rows (in the second direction) such as the second row, the fourth row, the sixth row . . . the (n+1)-th row, the first sub-pixel 101 and the second sub-pixel 102 could be arranged on the left side, and the third sub-pixel 103 could be arranged on the right side. Further, first sub-pixels 101 of all the pixel units 104 in a same row could be arranged in a straight line. Second sub-pixels 102 of all the pixel units 104 in the same row could be also arranged in a straight line. And third sub-pixels 103 of all the pixel units 104 in the same row could be arranged in a straight line.

In the present embodiment, shape of each of the first sub-pixel 101, the second sub-pixel 102 and the third sub-pixel 103 could be quadrangle. In other embodiments, shapes of the first sub-pixel 101, the second sub-pixel 102 and the third sub-pixel 103 could be one of triangular, quadrangle, pentagon, hexagon, octagon or any combination thereof, which is not limited here.

With the pixel structure provided in the present disclosure, a display clarity could be improved, and service life of products could be prolonged by increasing the light emitting area of the second sub-pixel 102.

Figure 2:
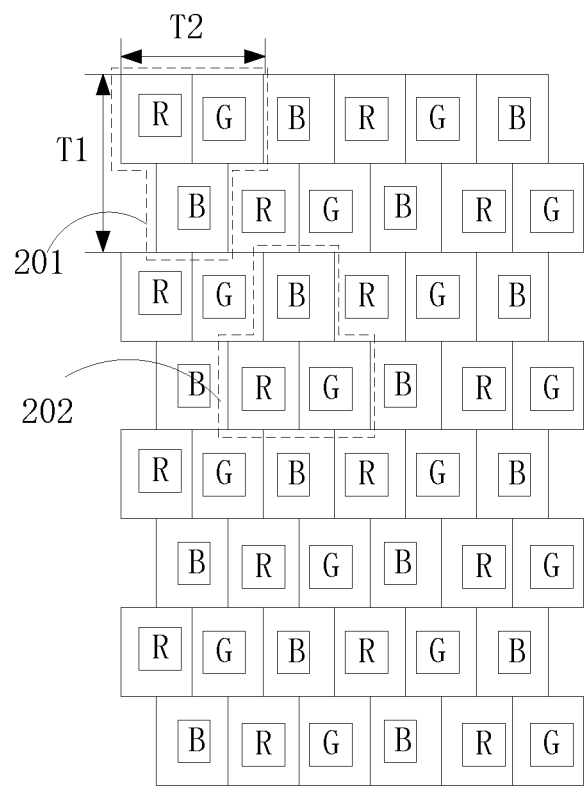
FIG. 2 is a schematic structural diagram of a pixel structure according to a second embodiment of the present disclosure.

Please refer to FIG. 2, FIG. 2 could be a schematic structural diagram of a pixel structure according to a second embodiment of the present disclosure. A difference between the present embodiment and the first embodiment could be that, the pixel structure shown in FIG. 1 could be rotated 90 degrees clockwise, such that rows and columns could be interchanged. If the first direction could be still referred to as the column direction (the vertical direction, the Y direction), and the second direction as the row direction (the traverse direction, the X direction), then it could be appreciated that, the first sub-pixel 101 (the red sub-pixel) and the second sub-pixel 102 (the green sub-pixel) could be arranged in one row, the third sub-pixel 103 (the blue sub-pixel) could be arranged in another row. The second sub-pixel could have a light emitting area greater than that of the third sub-pixel 103. The third sub-pixel 103 could have a light emitting area greater than that of the first sub-pixel 101.

In the present embodiment, a sum of a length of the first sub-pixel 101 along the second direction and a length of the second sub-pixel 102 along the second direction could be greater than a total length of the third sub-pixel 103 along the second direction. The projection of the third sub-pixel 103 along the first direction could be at least partially overlapped with the projection of the first sub-pixel 101 along the first direction and the projection of the second sub-pixel 102 along the first direction.

Specifically, since pixel units 104 in the present disclosure could be arranged in mode that is more compact, the total length T1 of a pixel unit 104 along the first direction could be greater than the total length T2 of the pixel unit 104 along the second direction, such as T1:T2=3:2. In this way, compared to conventional square shaped pixel units 104 (in which ratio between the length along the second direction and the length along the first direction is 1:1), such a pixel arrangement structure increases traverse pixel gap of the screen, thus facilitating the array wiring and the evaporation of organic light emitting diodes.

Figure 3:
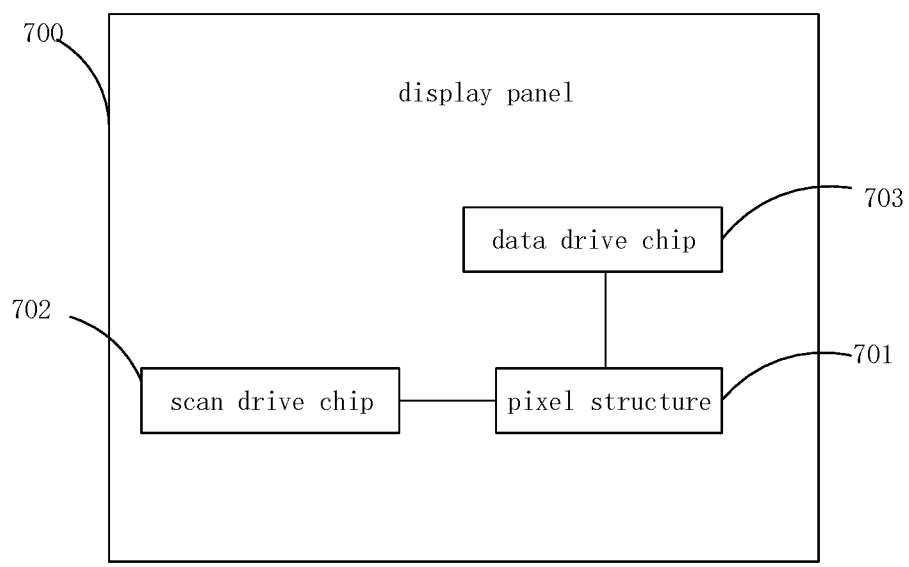
FIG. 3 is a schematic structural diagram of a display panel in the present disclosure.

Please refer to FIG. 3. FIG. 3 is a schematic structural diagram of a display panel in the present disclosure. The display panel 700 could include a pixel structure 701 of any above-mentioned embodiments. The pixel structure 701 could be transversely connected to a scan drive chip, and could be connected to a data drive chip 703 along the longitudinal direction. It should be noted that, a scan line could be connected between each sub-pixel of the pixel structure and the scan drive chip 702, to receive a scan signal from the scan chip. A data line could be connected between each sub-pixel of the pixel structure and the data drive chip 703, to receive a data signal from the data drive chip. The display panel 700 could be an organic light-emitting display panel, and could be applied to any product or component having a display function, such as a mobile phone, a tablet computer, a television, a display screen, a notebook computer, a digital photo frame, or a navigator. Other components and functions of the display panel could be identical to those of the existing display panel, and will not be repeated here.

Figure 4:
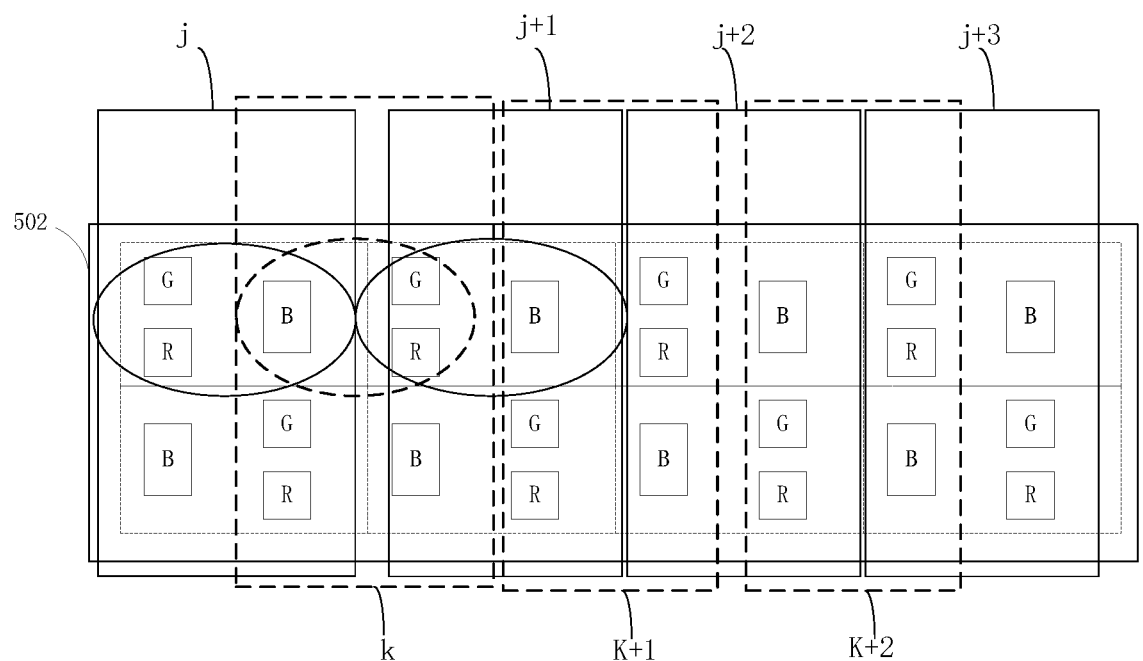
FIG. 4 is a schematic diagram of a display method for a display panel in the present disclosure.

Please refer to FIG. 4, each pixel unit 104 of the pixel arrangement 502 in the display panel could be transversely (the second direction, the X direction) connected to the scan drive chip (as is shown in FIG. 3 by 702), to receive a scan signal from the scan drive chip. Each pixel unit 104 of the pixel arrangement 502 in the display panel could be connected to the data drive chip (as is shown in FIG. 3 by 703) along a column direction(the first direction, the Y direction), to receive a data signal from the data drive chip. During display, the scan driver chip could output scan signals to each sub-pixel in each row of pixel units 104 to control the conduction of a thin-film transistor (not shown in the figures) connected to each sub-pixel in each row of pixel units. The data drive chip could output data signals to each sub-pixel, to control each sub-pixel to emit light. It should be noted that, each sub-pixel in the pixel structure could be connected to a scan line and a data line (not shown in the figures).

Sub-pixels of the pixel structure could be all transversely connected to a scan drive chip and could be connected to a data drive chip in the longitudinal direction. Each sub-pixel in each row of pixel units 104 of the pixel structure could receive a scan signal from the scan drive chip, to control the conduction of a thin film transistor connecting to each sub-pixel in each row of pixel units.

In a first time period t1, sub-pixels in the j-th, (j+1)-th, (j+2)th . . . (j+i)-th rows of pixel units 104 could receive data signals from the data drive chip and emit light. In the second time period t2, sub-pixels in the k-th, (k+1)-th, (k+2)th . . . (k+i)-th rows of pixel units 104 could receive voltage signals from the data drive chip and then emit light. Or, in a first time period t1, sub-pixels in the k-th, (k+1)-th, (k+2)th . . . (k+i)-th rows of pixel units 104 could receive voltage signals from the data drive chip and then emit light. In the second time period t2, sub-pixels in the j-th, (j+1)th, (j+2)th . . . (j+i)th rows of pixel units 104 could receive data signals from the data drive chip and then emit light.

An interval time between the first time period and the second time period could be very short, and since the present pixel structure increases the pixel aperture ratio, the display brightness could remain unchanged.

In the first, third, fifth . . . n-th rows (in the second direction, the X direction) of pixel units, the third sub-pixels of the j-th, (j+2)-th, (j+4)-th . . . rows of pixel units 104 and the first and the second sub-pixels of the (j+1)-th, (j+3)-th, (j+5)-th . . . rows of pixel units 104 could form the k-th, (k+1)-th, (k+2)-th, (k+3)-th . . . rows of pixel units; Or, in the second, fourth, sixth . . . (n+1)-th rows (in the second direction, the X direction) of pixel units, the first and the second sub-pixels of the j-th, (j+2)-th, (j+4)-th . . . rows of pixel units 104 and the third sub-pixels of the (j+1)-th, (j+3)th, (j+5)-th . . . rows of pixel units 104 could form the k-th, (k+1)-th, (k+2)-th, (k+3)-th . . . rows of pixel units. That is, two pixel units 104 in this embodiment could achieve a display effect same to that of three conventional pixel units. In this way, a display resolution of the display panel incorporating the pixel structure described in the disclosure could be greatly improved. For example, the display resolution could be changed from 720×2340 to 1080×2340, thereby enhancing the display effect of the display panel.

The above are only implementations of the present disclosure, and do not limit the patent scope of the present disclosure. Any equivalent changes to structures or processes made by the description and drawings of this application or directly or indirectly used in other related technical field could be encompassed in a protection scope of this disclosure.

What is claimed is:

1. A pixel structure, comprising:
a plurality of pixel units arranged in a matrix along a first direction and a second direction, wherein each of the pixel units further comprises a first sub-pixel, a second sub-pixel and a third sub-pixel, and the first, second and third sub-pixels are wholly included in each of the pixel units without dividing any of the first, second and third sub-pixels;
in each of the pixel units, the third sub-pixel is arranged in a line along the first direction, while the first sub-pixel and the second sub-pixel are arranged in another line along the first direction; the second sub-pixel has a light-emitting area greater than that of the third sub-pixel, and the third sub-pixel has a light-emitting area greater than that of the first sub-pixel, and the first direction and the second direction are intersected with each other,
wherein within each of the pixel units, a sum of a length of the first sub-pixel and a length of the second sub-pixel along the first direction is greater than a length of the third sub-pixel along the first direction,
wherein the area of the second sub-pixel is larger than each area of the first sub-pixel and the third sub-pixel.

2. The pixel structure according to claim 1, wherein a projection of the third sub-pixel along the second direction is at least partially overlapped with a projection of the first sub-pixel along the second direction and a projection of the second sub-pixel along the second direction.

3. The pixel structure according to claim 1, wherein the first sub-pixel is a red sub-pixel, the second sub-pixel is a green sub-pixel, and the third sub-pixel is a blue sub-pixel.

4. The pixel structure according to claim 1, wherein a ratio among the first sub-pixel, the second sub-pixel and the third sub-pixel in the light-emitting area is 1:1.84:1.68.

5. The pixel structure according to claim 1, wherein a shape of each of the sub-pixels is rectangular.

6. The pixel structure according to claim 5, wherein a ratio between a maximal length of each of the pixel units along the second direction and a maximum length of each of the pixel units along the first direction is 3:2.

7. The pixel structure according to claim 1, wherein the plurality of pixel units are arranged in a pixel array,
in the pixel array, pixel units in the n-th line are engaged with pixel units in the (n+1)-th line, and n is an integer number.

8. The pixel structure according to claim 7, wherein pixel units in the n-th line are arranged in a mode same to that of pixel units in the (n+2)-th line.

9. The pixel structure according to claim 7, wherein in the pixel array, the third sub-pixel of an i-th pixel unit in the n-th line is aligned with the first sub-pixel and the second sub-pixel of the i-th pixel unit in the (n+1)-th line, the first sub-pixel and the second sub-pixel of the i-th pixel unit in the n-th line is aligned with the third sub-pixel of the i-th pixel unit in the (n+1)-th line, and i is an integer number.

10. A display panel, comprising:
a pixel structure including a plurality of pixel units arranged in a matrix along a first direction and a second direction, wherein each of the pixel units comprises a first sub-pixel, a second sub-pixel and a third sub-pixel, and the first, second and third sub-pixels are wholly included in each of the pixel units without dividing any of the first, second and third sub-pixels;
in each of the pixel units, the third sub-pixel is arranged in a line along the first direction, while the first sub-pixel and the second sub-pixel are arranged in another line along the first direction, the second sub-pixel has a light-emitting area greater than that of the third sub-pixel, and the third sub-pixel has a light-emitting area greater than that of the first sub-pixel, and the first direction and the second direction are intersected with each other,
wherein within each of the pixel units, a sum of a length of the first sub-pixel and a length of the second sub-pixel along the first direction is greater than a length of the third sub-pixel along the first direction,
wherein the area of the second sub-pixel is larger than each area of the first sub-pixel and the third sub-pixel.

11. The display panel according to claim 10, wherein a projection of the third sub-pixel along the second direction is at least partially overlapped with a projection of the first sub-pixel along the second direction.

12. The display panel according to claim 10, wherein the first sub-pixel is a red sub-pixel, the second sub-pixel is a green sub-pixel, the third sub-pixel is a blue sub-pixel.

13. The display panel according to claim 10, wherein a ratio among the first sub-pixel, the second sub-pixel and the third sub-pixel in the light emitting area is 1:1.84:1.68.

14. The display panel according to claim 10, wherein a shape of each of the sub-pixels is rectangular.

15. The display panel according to claim 14, wherein a ratio between a maximal length of each of the pixel units along the second direction and a maximal length of each of the pixel units along the first direction is 3:2.

16. The display panel according to claim 10, wherein the plurality of pixel units are arranged in a pixel array,
in the pixel array, the pixel units in the n-th line are engaged with pixel units in the (n+1)-th row, and the third sub-pixel of an i-th pixel unit in the n-th line is aligned with the first sub-pixel and the second sub-pixel of the i-th pixel unit in the (n+1)-th row, the first sub-pixel and the second sub-pixel of the i-th pixel unit in the n-th line is aligned with the third sub-pixel of the i-th pixel unit in the (n+1)-th row, pixel units in the n-th line are arranged in a mode same to that of pixel units in the (n+2)-th line, n and i are both integer numbers.

17. A method for controlling a display panel to emit light, comprising:
outputting a scan signal to each sub-pixel in each line of pixel units, to control a conduction of a thin film transistors connecting to each sub-pixel in each line of pixel units;
in a first time period, outputting a data signal to each sub-pixel in the j-th, (j+1)-th . . . (j+i)-th lines of pixel units to enable the sub-pixel to emit light;
in a second time period, outputting a data signal to each sub-pixel in the k-th, (k+1)-th . . . (k+i)-th lines of pixel units to enable the sub-pixel to emit light, j, k and i are all integer numbers;
the j-th line of pixel units and the k-th line of pixel units are in a first direction;
wherein the pixel units arranged in a matrix along the first direction and a second direction, wherein each of the pixel units comprises a first sub-pixel, a second sub-pixel and a third sub-pixel, wherein in each of the pixel units, the third sub-pixel is arranged in a line along the first direction, while the first sub-pixel and the second sub-pixel are arranged in another line along the first direction, and the first direction and the second direction are intersected with each other, wherein the third sub-pixels of the j-th, (j+2)-th, (j+4)-th ... (j+m)-th lines of pixel units and the first and the second sub-pixels of the (j+1)-th, (j+3)-th, (j+5)-th ... (j+n)-th lines of pixel units form the k-th, (k+1)-th, (k+2)-th, (k+3)-th ... (k+i)-th lines of pixel units, wherein m is an even number, and n is an odd number, wherein during the first and second time periods, all sub-pixels of the k-th, (k+1)-th, (k+2)-th, (k+3)-th ... (k+i)-th pixel units emit light twice.

* * * * *